US012681066B2

(12) United States Patent
Ramian et al.

(10) Patent No.: US 12,681,066 B2
(45) Date of Patent: Jul. 14, 2026

(54) MEASUREMENT DEVICE FOR PERFORMING MEASUREMENTS WITH RESPECT TO A DUT

(71) Applicant: Rohde & Schwarz GmbH & Co. KG, Munich (DE)

(72) Inventors: Florian Ramian, Karlsfeld (DE); Kay-Uwe Sander, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 122 days.

(21) Appl. No.: 18/512,782

(22) Filed: Nov. 17, 2023

(65) Prior Publication Data

US 2024/0219442 A1      Jul. 4, 2024

(30) Foreign Application Priority Data

Dec. 30, 2022      (EP) ..................................... 22217261

(51) Int. Cl.
*G01R 29/26*           (2006.01)
*G01R 31/28*           (2006.01)
(52) U.S. Cl.
CPC ......... *G01R 29/26* (2013.01); *G01R 31/2837* (2013.01)
(58) Field of Classification Search
None
See application file for complete search history.

(56) References Cited

U.S. PATENT DOCUMENTS 6,393,372 B1 * 5/2002 Rzyski ................... G01R 23/20
                                                              702/69
6,405,147 B1   6/2002 Fera 6,567,762 B2   5/2003 Bourde et al.
8,965,727 B2 * 2/2015 Rzyski ................... H03F 1/3223
                                                              330/149
9,140,730 B2 * 9/2015 Otani .................... G01R 23/173
9,209,845 B2 * 12/2015 Nentwig ................. H04B 1/10
9,423,440 B2 * 8/2016 Pausini ............ G01R 31/31709
(Continued)

FOREIGN PATENT DOCUMENTS

WO          2015089090 A4      6/2015

OTHER PUBLICATIONS

Office Action for related European Patent Application No. 22217261.1-1001, dated Jun. 28, 2023, 5 pages.

*Primary Examiner* — Richard Isla
(74) *Attorney, Agent, or Firm* — DITTHAVONG, STEINER, & MLOTKOWSKI

(57)          ABSTRACT

A measurement device (10*a*) for performing measurements with respect to a device under test (13) is provided. Said measurement device (10*a*) comprises a port (11*a*) for receiving a signal from the device under test (13), a signal level modification unit (14) for modifying the corresponding level of the signal in order to form a modified signal, the signal level modification unit (14) being operable in at least a first operation mode and a second operation mode being different from the first operation mode, a receiving unit (15) for receiving and digitizing the modified signal in order to a form a digitized modified signal, and a processing unit (16).

The signal level of the first operation mode is set, e.g. by an attenuator of the device, such the signal-to-noise-ratio is high but the receiving unit causes non-linearity effects, and the signal level of the second operation mode is set lower, e.g. by an attenuator of the device, such that the receiving unit causes essentially no non-linearity effects.

14 Claims, 9 Drawing Sheets

(56) References Cited

U.S. PATENT DOCUMENTS

| 10,120,008 | B2 * | 11/2018 | Cutler | G01R 29/26 |
|---|---|---|---|---|
| 10,404,372 | B2 * | 9/2019 | Nowak | H04B 1/18 |
| 12,025,638 | B1 * | 7/2024 | Gines | G01R 29/26 |
| 12,484,264 | B2 * | 11/2025 | Kawasaki | H10D 62/157 |
| 2005/0152705 | A1 * | 7/2005 | Inoue | G08C 23/04 |
| | | | | 398/202 |
| 2007/0225927 | A1 * | 9/2007 | Bessho | G01R 29/26 |
| | | | | 702/72 |
| 2009/0058521 | A1 | 3/2009 | Fernandez | |

* cited by examiner

MEASUREMENT DEVICE FOR PERFORMING MEASUREMENTS WITH RESPECT TO A DUT

This application claims priority to European Patent Application No. 22 217 261.1, filed on Dec. 30, 2022, titled "Measurement Device for Performing Measurements with Respect to a DUT," the contents of which is hereby incorporated by reference in its entirety.

The invention relates to a measurement device for performing measurements with respect to a device under test, a measurement system comprising such a measurement device and a device under test, and a measurement method for performing measurements with respect to a device under test. In this context, non-linear contributions of the measurement device are determined, thereby allowing for a corresponding compensation thereof without or with reduced needs of predistortion.

Generally, in times of an increasing number of applications employing circuitry, especially radio frequency circuitry, there is a growing need of a measurement device, a measurement system comprising such a measurement device, and a measurement method for performing measurements with respect to a device under test comprising such applications in order to verify their correct functioning.

For instance, U.S. Pat. No. 6,567,762 B2 relates to extending the dynamic range of lower power signal measurements in the presence of higher power signals.

Furthermore, US 2009/0058521 A1 refers to reducing nonlinear signal distortion of a primary signal within an electronic device. A corresponding method includes the steps of applying at least one stimulus signal to excite distortion, analyzing nonlinear effects in the distorted stimulus signal, modeling distortion as a function of the stimulus signal, and creating a correction signal using the distortion model and the primary signal. Disadvantageously, such a kind of predistortion does not allow for a maximum signal-to-noise ratio.

Accordingly, there is the object to provide a measurement device for performing measurements with respect to a device under test, a measurement system comprising such a measurement device and a device under test, and a measurement method for performing measurements with respect to a device under test, thereby ensuring a high accuracy and efficiency of the measurement especially in the sense of a maximum signal-to-noise ratio due to an omission or reduction of predistortion.

This object is solved by the features of the independent claims. The dependent claims contain further developments.

According to a first aspect of the invention, a measurement device for performing measurements with respect to a DUT is provided. Said measurement device comprises a port for receiving a signal from the device under test, a signal level modification unit for modifying the corresponding level of the signal in order to form a modified signal, the signal level modification unit being operable in at least a first operation mode and a second operation mode being different from the first operation mode, a receiving unit for receiving and digitizing the modified signal in order to a form a digitized modified signal, and a processing unit. In this context, the processing unit is configured to receive a first data stream of the digitized modified signal for the case that the signal level modification unit is operated in the first operation mode and to receive a second data stream for the case that the signal level modification unit is operated in the second operation mode. In addition to this, the processing unit is configured to determine information regarding non-linearity of the receiving unit on the basis of a comparison of the first data stream and the second data stream. Advantageously, a high accuracy and efficiency of the measurement especially in the sense of a maximum signal-to-noise ratio can be ensured. Further advantageously, the non-linear contributions of the measurement device can reliably be determined, thereby allowing for preventing the measurement device from overcompensating the device under test, which would result in measurement errors because in the case of an overcompensation, also non-linear contributions from the device under test are compensated, which must not be compensated but rather being the measurement goal.

Thus, one of the two operating modes may be set for a high signal-to-noise-ratio at the cost of linearity. The second mode allows measuring the non-linear characteristics (contribution) of the device (receiver). These non-linear characteristics are than corrected on the first stream. The corrected first stream is then analyzed to characterize the DUT (e.g. using EVM).

With respect to the first data stream and the second data stream, it is noted that it might be particularly advantageous if one of the first data stream and the second data stream is such that no non-linear effects can be expected, while the other one has a level in which non-linearities may be expected, but the SNR is preferably improved.

Thus, the signal level of the first operation mode is set, e.g. by an attenuator of the device, such the signal-to-noise-ratio is high but the receiving unit causes non-linearity effects, and the signal level of the second operation mode is set lower, e.g. by an attenuator of the device, such that the receiving unit causes essentially no non-linearity effects.

According to a first preferred implementation form of the first aspect of the invention, the signal comprises or is a radio frequency signal. In addition to this or as an alternative, the receiving unit comprises non-linearities and/or at least one non-linear element, especially an amplifier and/or a mixer. Further additionally or further alternatively, the measurement device comprises or is a signal analyzer, a vector network analyzer, or an oscilloscope. Advantageously, for instance, a high flexibility can be ensured, thereby increasing efficiency.

According to a second preferred implementation form of the first aspect of the invention, the signal level modification unit comprises or is an adjustable attenuation unit or at least one attenuator. In addition to this or as an alternative, the first operation mode comprises applying a first attenuation to the signal. Further additionally or further alternatively, the second operation mode comprises applying a second attenuation to the signal, wherein the first attenuation is preferably higher than the second attenuation. Advantageously, for example, the adjustable attenuation unit and/or the at least one attenuator can comprise or be at least one resistive element, thereby reducing complexity, which leads to reduced costs and an increased efficiency.

In the context of the first attenuation being higher than the second attenuation, it is noted it that it might be particularly advantageous if the first data stream is such that no non-linear effects can be expected, while the second data stream has a level in which non-linearities may be expected, but the SNR is preferably improved.

According to a further preferred implementation form of the first aspect of the invention, the signal level modification unit is free of an amplifier and/or a diode. Advantageously, for instance, non-linearities regarding the signal level modification unit can efficiently be prevented, thereby ensuring a particularly high accuracy.

According to a further preferred implementation form of the first aspect of the invention, the receiving unit comprises at least one of a filter, an amplifier, a mixer, an analog-to-digital converter, or any combination thereof. Advantageously, for example, non-linearities of the receiving unit cannot lead to erroneous measurements.

According to a further preferred implementation form of the first aspect of the invention, the signal comprises or is a periodic signal. In addition to this or as an alternative, the first data stream and the second data stream comprise the same pattern, preferably a periodic pattern, more preferably a periodic cycle, most preferably the same periodic pattern and/or the same periodic cycle, of the digitized modified signal. Advantageously, for instance, both accuracy and efficiency can further be increased.

According to a further preferred implementation form of the first aspect of the invention, the processing unit is configured to generate an AM/AM table and/or an AM/AM curve (or an AM/PM table and/or an AM/PM curve) on the basis of the information regarding non-linearity of the receiving unit. Advantageously, for example, the information regarding non-linearity of the receiving unit can be illustrated in a simple manner, thereby reducing inefficiencies.

Other characterization/compensation methods may be used in addition or instead of such AM/AM or AM/PM approaches, such as memory polynomial, Volterra, Look-up tables or other models known from digital predistortion (DPD). According to a further preferred implementation form of the first aspect of the invention, a first axis, especially the x-axis, of the AM/AM curve comprises an input parameter, especially an input power, of the measurement device. In addition to this or as an alternative, a second axis, especially the y-axis, of the AM/AM curve comprises an output parameter, especially an output power, of the device under test. Advantageously, for instance, the above-mentioned AM/AM table may comprise said first axis and/or said second axis in the form of a table.

According to a further preferred implementation form of the first aspect of the invention, the measurement device comprises a display unit for visualizing the information regarding non-linearity of the receiving unit, especially the AM/AM table and/or the AM/AM curve. Advantageously, for example, a user can see non-linear contributions of the measurement device at one glance, which leads to an increased efficiency.

According to a further preferred implementation form of the first aspect of the invention, the processing unit is configured to compensate further measurements with respect to the device under test on the basis of the information regarding non-linearity of the receiving unit. Advantageously, for instance, especially due to an omission of any kind of predistortion in the context of compensating non-linear contributions, said compensation allows for a maximum signal-to-noise ratio.

According to a further preferred implementation form of the first aspect of the invention, the measurement device comprises at least one further port for receiving at least one further signal from the device under test or from at least one further device under test, at least one further signal level modification unit for modifying the corresponding level of the at least one further signal in order to form at least one further modified signal, the at least one further signal level modification unit being operable in at least at least one further first operation mode and at least one further second operation mode being different from the at least one further first operation mode, and at least one further receiving unit for receiving and digitizing the at least one further modified signal in order to a form at least one further digitized modified signal. In this context, the processing unit is configured to receive at least one further first data stream of the at least one further digitized modified signal for the case that the at least one further signal level modification unit is operated in the at least one further first operation mode and to receive at least one further second data stream for the case that the at least one further signal level modification is operated in the at least one further second operation mode. In addition to this, the processing unit is configured to determine at least one further information regarding non-linearity of the at least one further receiving unit on the basis of a comparison of the at least one further first data stream and the at least one further second data stream. Advantageously, for example, in the case that the measurement device comprises multiple ports, a high accuracy and efficiency can be ensured with respect to each of said multiple ports.

According to a further preferred implementation form of the first aspect of the invention, the measurement device is used for and/or in the context of an error vector magnitude measurement. In addition to this or as an alternative, the measurement device is used for and/or in the context of a measurement requiring a maximum signal-to-noise ratio. Advantageously, for instance, not only a particularly high accuracy but also a notably high efficiency can be ensured.

According to a second aspect of the invention, a measurement system is provided. Said measurement system comprises a measurement device according to the first aspect of the invention or any of its preferred implementation forms, respectively, and a device under test connected to said measurement device, especially to a port of the measurement device. Advantageously, a high accuracy and efficiency of the measurement especially in the sense of a maximum signal-to-noise ratio can be ensured. Further advantageously, the non-linear contributions of the measurement device can reliably be determined, thereby allowing for preventing the measurement device from overcompensating the device under test, which would result in measurement errors because in the case of an overcompensation, also non-linear contributions from the device under test are compensated, which must not be compensated but rather being the measurement goal.

According to a third aspect of the invention, a measurement method for performing measurements with respect to a device under test is provided. Said measurement method comprises the steps of receiving a signal from the device under test, modifying the corresponding level of the signal with the aid of a signal level modification unit in order to form a modified signal, the signal level modification unit being operable in at least a first operation mode and a second operation mode being different from the first operation mode, receiving and digitizing the modified signal with the aid of a receiving unit in order to a form a digitized modified signal, receiving a first data stream of the digitized modified signal for the case that the signal level modification unit is operated in the first operation mode with the aid of a processing unit, receiving a second data stream for the case that the signal level modification unit is operated in the second operation mode with the aid of the processing unit, and determining information regarding non-linearity of the receiving unit on the basis of a comparison of the first data stream and the second data stream with the aid of the processing unit. Advantageously, a high accuracy and efficiency of the measurement especially in the sense of a maximum signal-to-noise ratio can be ensured. Further advantageously, the non-linear contributions of the receiving unit or the corresponding measurement device, respectively, can reliably be determined, thereby allowing for preventing the receiving unit or the corresponding measurement device, respectively, from overcompensating the device under test, which would result in measurement errors because in the case of an overcompensation, also non-linear contributions from the device under test are compensated, which must not be compensated but rather being the measurement goal.

The signal level of the first operation mode is set, e.g. by an attenuator of the device, such the signal-to-noise-ratio is high but the receiving unit causes non-linearity effects, and the signal level of the second operation mode is set lower, e.g. by an attenuator of the device, such that the receiving unit causes essentially no non-linearity effects.

According to a first preferred implementation form of the third aspect of the invention, the signal comprises or is a radio frequency signal. In addition to this or as an alternative, the receiving unit comprises non-linearities and/or at least one non-linear element, especially an amplifier and/or a mixer.

For the sake of completeness, it is noted that all explanations regarding the first aspect of the invention or any of its preferred implementation forms can analogously apply for the third aspect of the invention or the preferred implementation forms thereof, respectively, and vice versa.

Exemplary embodiments of the invention are now further explained with respect to the drawings by way of example only, and not for limitation. In the drawings.

Figure 5:
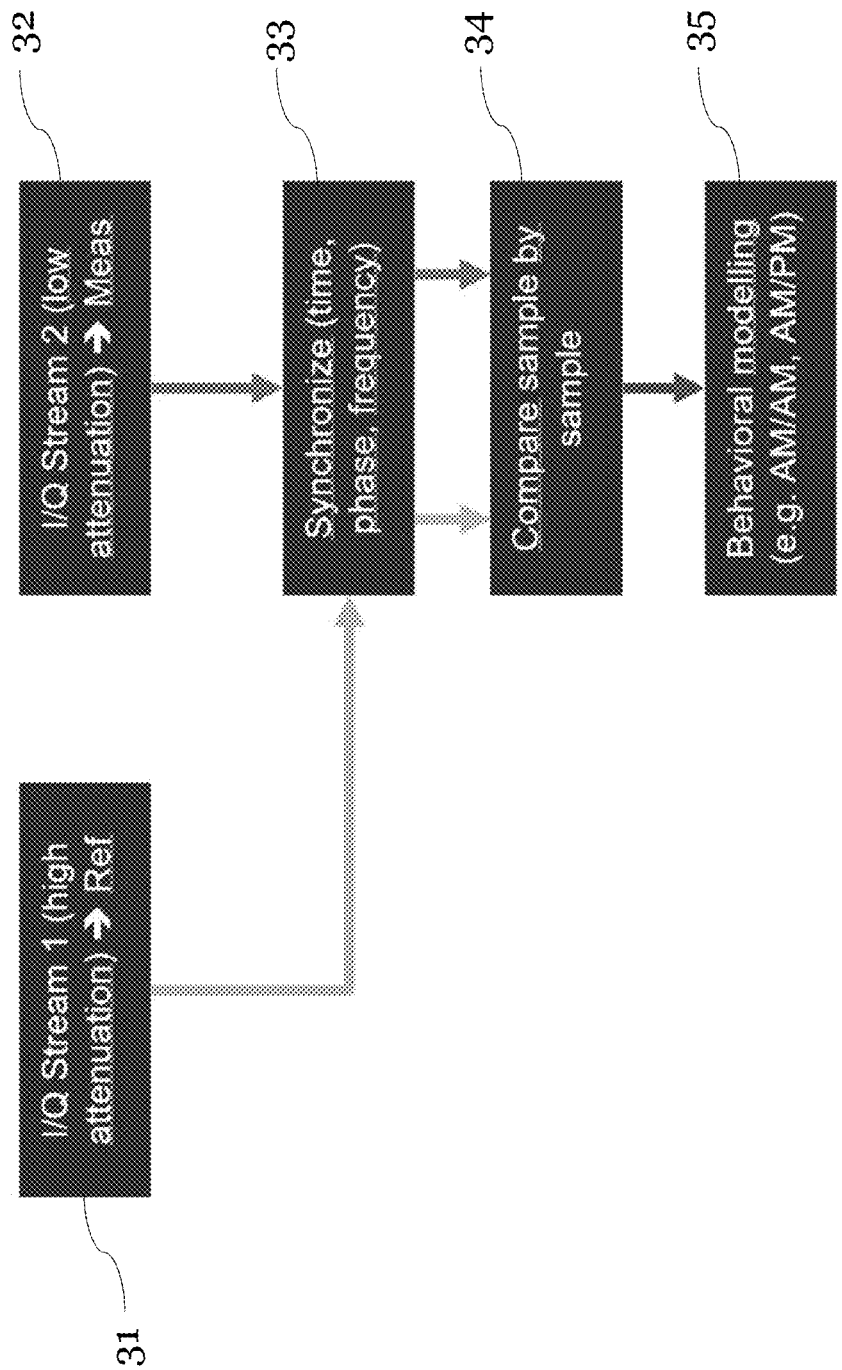
Figure 6A:
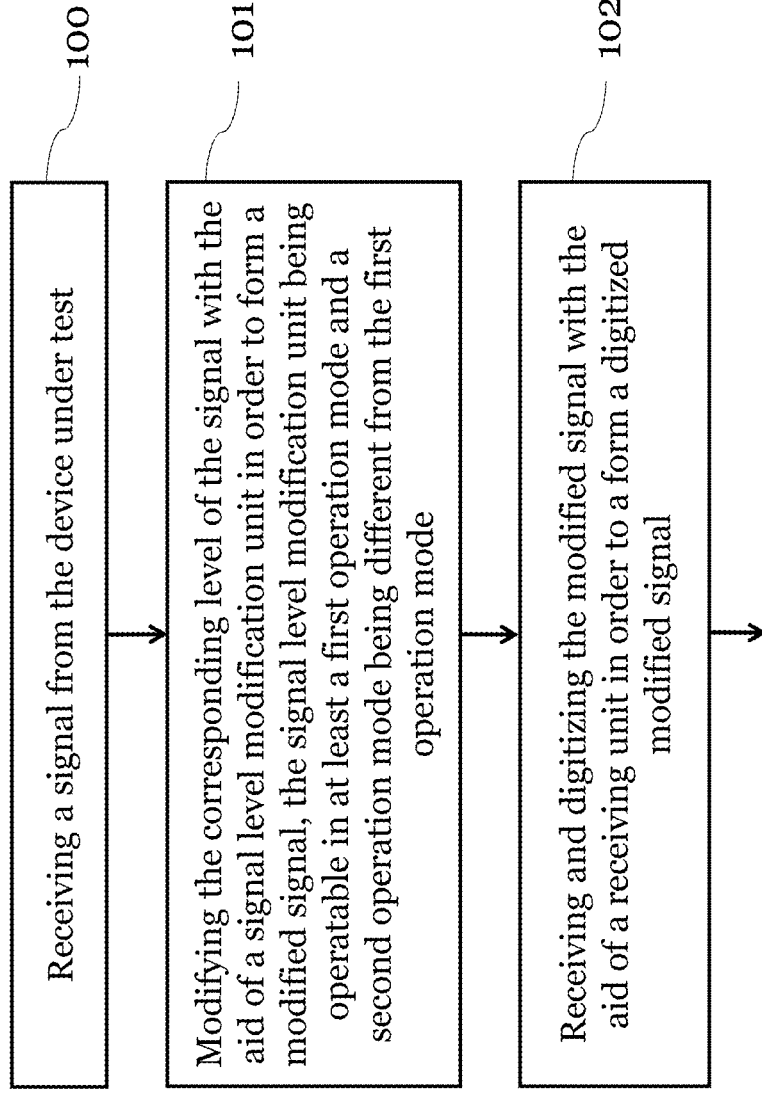
Figure 6B:
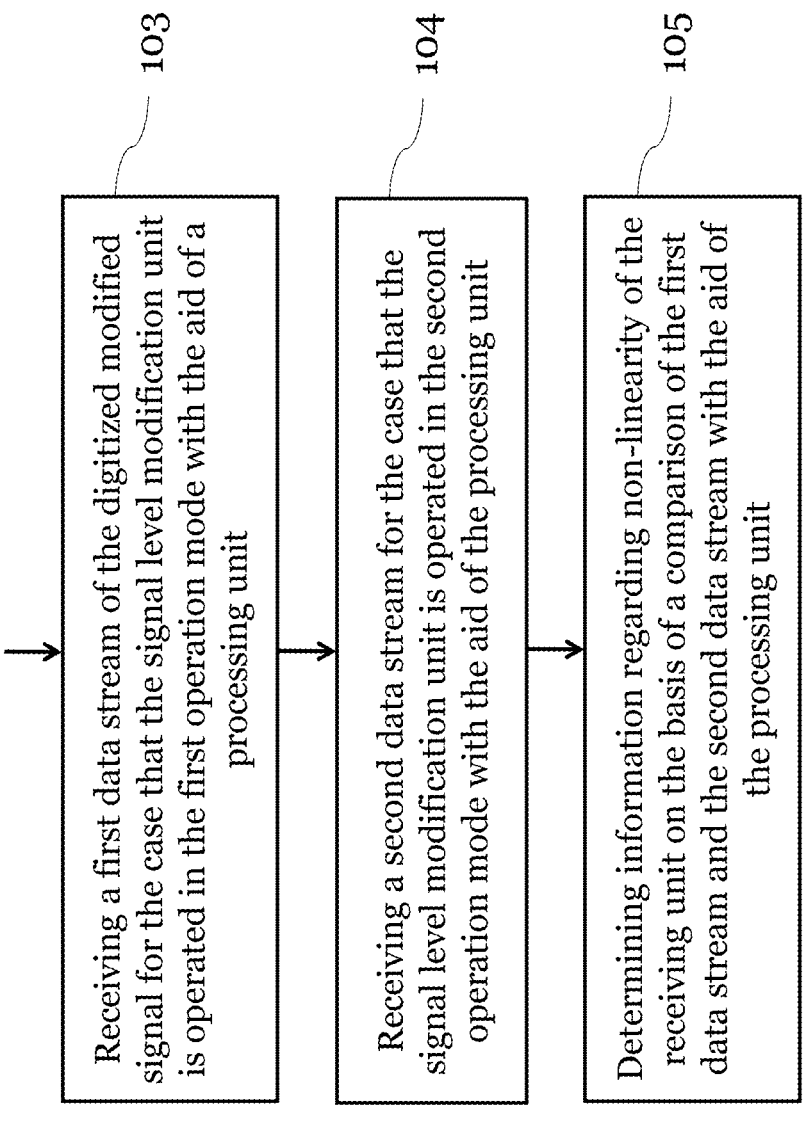

FIG. 5 an exemplary block diagram with respect to functioning regarding the inventive non-linearity determination;

FIG. 6A shows a flow chart of an embodiment of the second aspect of the invention; and FIG. 6B shows further steps of the embodiment according to FIG. 6A.

Figure 1:
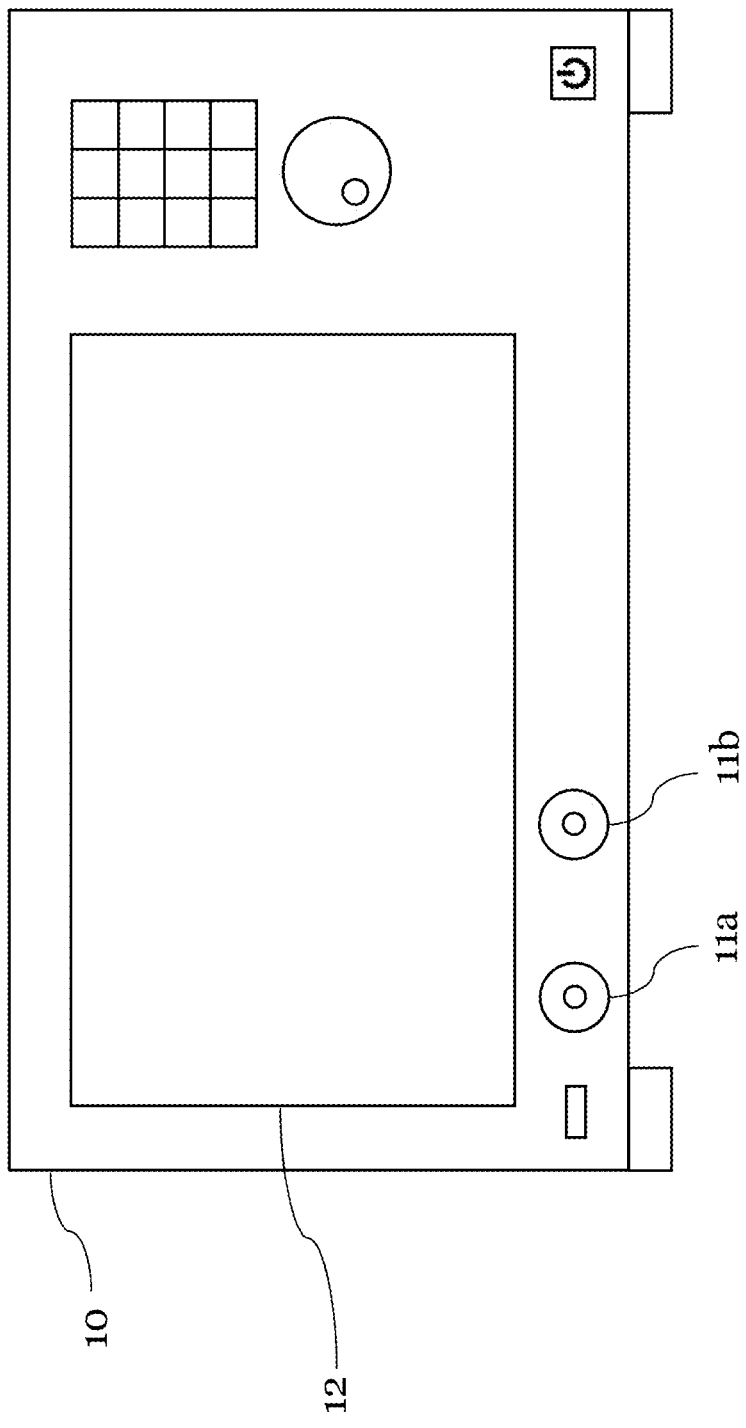
FIG. 1 shows an exemplary embodiment of an inventive measurement device.

With respect to FIG. 1, an exemplary embodiment of the inventive measurement device 10a for performing measurements with respect to at least one device under test is illustrated. Exemplarily, said measurement device 10a comprises a first port 11a and a second port 11b for connecting the at least one device under test. It is noted that especially as an alternative, the measurement device 10a can comprise only one port or at least three ports.

As it can further be seen from FIG. 1, the measurement device 10a comprises a display unit 12. Said display unit 12 or display, respectively, may be configured to display measurement results especially regarding the measurements performed with respect to the at least one device under test and/or information regarding non-linearity of the measurement device.

With respect to the measurement device 10a, it is noted that said measurement device 10a can especially comprise or be a signal analyzer, a vector network analyzer, or an oscilloscope.

Figure 2A:
FIG. 2A shows the measurement device according to FIG. 1 in greater detail in combination with the inventive measurement system.

In accordance with FIG. 2A, the measurement device 10a according to FIG. 1 is shown in greater detail in combination with the inventive measurement system 20a comprising said measurement device 10a and at least one device under test, exemplarily the device under test 13. In this context, said device under test 13 is exemplarily connected to the first port 11a of the measurement device 10a, wherein the first port 11a is configured to receive a signal from the device under test 13.

As it can be seen from FIG. 2A, the measurement device 10a further comprises a signal level modification unit 14 for modifying the corresponding level of the signal in order to form a modified signal, wherein the signal level modification unit 14 is operable in at least a first operation mode and a second operation mode being different from the first operation mode. It is noted that the signal level modification unit 14 is exemplarily connected to the port or the first port 11a, respectively.

Furthermore, the measurement device 10a comprises a receiving unit 15 for receiving and digitizing the modified signal in order to a form a digitized modified signal. It is noted that said receiving unit 15 is exemplarily connected to the above-mentioned signal level modification unit 14.

Moreover, the measurement device 10a comprises a processing unit 16 being exemplarily connected to the above-mentioned signal level modification unit 14 and to the above-mentioned receiving unit 15.

In this context, the processing unit 16 is configured to receive a first data stream of the digitized modified signal for the case that the signal level modification unit 14 is operated in the first operation mode and to receive a second data stream for the case that the signal level modification unit 14 is operated in the second operation mode.

In addition to this, the processing unit 16 is configured to determine information regarding non-linearity of the receiving unit 15 on the basis of a comparison of the first data stream and the second data stream.

With respect to the above-mentioned signal, it is noted that said signal may comprise or be a radio frequency signal.

With respect to the receiving unit 15, it is noted that the receiving unit 15 may comprise non-linearities and/or at least one non-linear element.

In particular, as it can be seen from FIG. 2A, the receiving unit 15 exemplarily comprises a mixer 15a, an amplifier 15b, a filter 15c, especially a bandpass filter, and an analog-to-digital converter 15d.

In this context, an input of the mixer 15a is connected to an output of the signal level modification unit 14, wherein an output of the mixer 15a is connected to an input of the amplifier 15b. Furthermore, an output of said amplifier 15b is connected to an input of the filter 15c, wherein an output of said filter 15c is connected to an input of the analog-to-digital converter 15d. Additionally, an output of the analog-to-digital converter 15d is connected to an input of the above-mentioned processing unit 16.

With respect to the signal level modification unit 14, it is noted that the signal level modification unit 14 may comprise or be an adjustable attenuation unit or at least one attenuator. It is further noted that the signal level modification unit 14 may comprise at least one resistive element. Moreover, the adjustable attenuation unit or the at least one attenuator may comprise or be at least one resistive element.

Furthermore, especially in the context of the above-mentioned connection between the signal level modification unit 14 and the processing unit 16, it is noted that the signal level modification unit 14 may comprise an input, preferably a control input, being especially connected to an output, preferably a control output, of the processing unit 16. Accordingly, the processing unit 16 can be a control and processing unit.

With respect to the first operation mode, it is noted that the first operation mode comprises applying a first attenuation to the signal.

With respect to the second operation mode, it is noted that the second operation mode comprises applying a second attenuation to the signal.

The first attenuation is higher than the second attenuation. Accordingly, in the first operation mode, a high attenuation may be applied to the signal, whereas in the second operation mode, a low attenuation may applied to the signal. Preferably, in the first operation mode, a maximum attenuation of the signal level modification unit 14 may be enabled, whereas in the second operation mode, an attenuation of the signal level modification unit 14 may completely be disabled.

In the context of the first attenuation being higher than the second attenuation, it is noted it that it might be particularly advantageous if the first data stream is such that no non-linear effects can be expected, while the second data stream has a level in which non-linearities may be expected, but the SNR is preferably improved.

Thus, one of the two operating modes may be set for a high signal-to-noise-ratio at the cost of linearity. The second mode allows measuring the non-linear characteristics (contribution) of the device (receiver). These non-linear characteristics are than corrected on the first stream. The corrected first stream is then analyzed to characterize the DUT (e.g. using EVM).

It is further noted that it might be particularly advantageous if the signal level modification unit 14 is free of an amplifier and/or a diode.

With respect to the signal, it is noted that it might be particularly advantageous if the signal comprises or is a periodic signal. Accordingly, especially with the aid of the measurement device 10a, the device under test 13 may be configured to provide a periodic signal.

Furthermore, it might be particularly advantageous if the first data stream and the second data stream comprise the same pattern, preferably a periodic pattern, more preferably a periodic cycle, most preferably the same periodic pattern and/or the same periodic cycle, of the digitized modified signal.

With respect to the above-mentioned term "the same", it is noted that said term may especially be understood as referring to an analogous portion of the respective signal, wherein the corresponding attenuation preferably differs from each other.

As it can further be seen from FIG. 2A, the processing unit 16 exemplarily comprises a first storage element 16a for storing a first pattern, especially a first radio frequency pattern, with respect to the first data stream preferably with the first attenuation (ATT 1), a second storage element 16b for storing a second pattern, especially a second radio frequency pattern, with respect to the second data stream preferably with the second attenuation (ATT 2), and a comparison element 16c for comparing the first pattern and the second pattern.

With respect to the above-mentioned storing the first pattern and the second pattern, it is noted that this may preferably happen at different time points $t_1$ and $t_2$.

In this context, it is further noted that it does not matter in which order which pattern is stored. In addition to this or as an alternative, the corresponding pattern can be determined on the basis of the pattern already stored especially with the aid of a cross-correlation and/or artificial intelligence.

Furthermore, especially on the basis of the comparison of the first pattern and the second pattern, the comparison element 16c may be configured to provide information regarding non-linearity of the receiving unit 15 and/or at least one corresponding compensation value.

For the sake of completeness, it is noted that the above-mentioned input of the processing unit 16, which is exemplarily connected to the output of the analog-to-digital converter 15d, is exemplarily connected to an input of the first storage element 16a and to an input of the second storage element 16b. Furthermore, an output of said first storage element 16a is exemplarily connected to a first input of the comparison element 16c, whereas an output of said second storage element 16b is exemplarily connected to a second input of the comparison element 16c. The above-mentioned information regarding non-linearity of the receiving unit 15 and/or at least one corresponding compensation value is exemplarily provided at an output of the comparison element 16c.

Moreover, it is noted that it might be particularly advantageous if the processing unit 16 is configured to generate an AM/AM table and/or an AM/AM curve (or e.g., an AM/PM table and/or an AM/PM curve), on the basis of the information regarding non-linearity of the receiving unit 15.

In this context, a first axis, especially the x-axis, of the AM/AM curve may comprise an input parameter, especially an input power, of the measurement device 10a. In addition to this or as an alternative, a second axis, especially the y-axis, of the AM/AM curve may comprise an output parameter, especially an output power, of the device under test 13. Accordingly, the above-mentioned AM/AM table may comprise said first axis and/or said second axis in the form of a table.

Other characterization/compensation methods may be used in addition or instead of such AM/AM or AM/PM approaches, such as memory polynomial, Volterra, Look-up tables or other models known from digital predistortion (DPD).

In addition to this or as an alternative, it is noted that it might be particularly advantageous if the processing unit 16 is configured to generate a polynomial form and/or a memory-polynomial form and/or a Volterra form on the basis of the information regarding non-linearity of the receiving unit 15.

With respect to the above-mentioned display unit 12, it is noted that said display unit 12 may be configured to visualize the information regarding non-linearity of the receiving unit 15, especially the AM/AM table and/or the AM/AM curve (or an AM/PM table and/or an AM/PM curve), preferably in addition to or as an alternative of corresponding measurement results.

It is further noted that it might be particularly advantageous if the processing unit 16 is configured to compensate further measurements with respect to the device under test 13 on the basis of the information regarding non-linearity of the receiving unit 15 and/or with the aid of the above-mentioned at least one corresponding compensation value.

Said information regarding non-linearity of the receiving unit 15 might be signal-specific. If the device under test 13 outputs a different signal, then the non-linearity of the receiving unit 15 may be determined once again. However, further measurements of the same device under test and the same signal can then advantageously be compensated by the then known none-linearity of the receiving unit 15.

For the sake of completeness, it is noted that for the case that the measurement device 10a comprises at least one further port, such as the second port 11b as depicted in FIG. 1, for receiving at least one further signal from the device under test or from at least one further device under test, the above-mentioned explanations may analogously apply.

Accordingly, the measurement device 10a may further comprise at least one further signal level modification unit for modifying the corresponding level of the at least one further signal in order to form at least one further modified signal, the at least one further signal level modification unit being operable in at least at least one further first operation mode and at least one further second operation mode being different from the at least one further first operation mode, and at least one further receiving unit for receiving and digitizing the at least one further modified signal in order to a form at least one further digitized modified signal.

In this context, the processing unit 16 may be configured to receive at least one further first data stream of the at least one further digitized modified signal for the case that the at least one further signal level modification unit is operated in the at least one further first operation mode and to receive at least one further second data stream for the case that the at least one further signal level modification is operated in the at least one further second operation mode.

In addition to this, the processing unit 16 may be configured to determine at least one further information regarding non-linearity of the at least one further receiving unit on the basis of a comparison of the at least one further first data stream and the at least one further second data stream.

With respect to the measurement device 10a, it is noted that it might be particularly advantageous if the measurement device 10a is used for and/or in the context of an error vector magnitude measurement. In addition to this or as an alternative, it might be particularly advantageous if the measurement device 10a is used for and/or in the context of a measurement requiring a maximum signal-to-noise ratio.

Figure 2B:
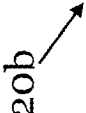
FIG. 2B shows a further exemplary embodiment of the measurement system comprising a further exemplary embodiment of the measurement device based on FIG. 2A.

Furthermore, FIG. 2B depicts a further exemplary embodiment 20b of the measurement system comprising a further exemplary embodiment of the measurement device 10b based on FIG. 2A.

The measurement device 10b according to said FIG. 2B especially differs from the one 10a of FIG. 2A in that the measurement device 10b additionally comprises a further signal level modification unit 24, a further receiving unit 25, and a signal splitter 27a being especially arranged within a housing of the measurement device 10b.

It is noted that the explanations above regarding the at least one further signal level modification unit or the at least one further receiving unit, respectively, may apply for said further signal level modification unit 24 or for said further receiving unit 25, respectively.

As it can exemplarily be seen from FIG. 2B, the further receiving unit 25 comprises a mixer 25a, an amplifier 25b, a filter 25c, especially a bandpass filter, and an analog-to-digital converter 25d.

It is noted that the explanation above regarding the mixer 15a, the amplifier 15b, the filter 15c, and the analog-to-digital converter 15d may analogously apply for the elements 25a, 25b, 25c, 25d.

Accordingly, especially using the signal splitter 27a, the signal level modification unit and the receiving unit can be doubled for the same signal path, which leads to the signal level modification unit 14, the further signal level modification unit 24, the receiving unit 15, and the further receiving unit 25.

In other words, an input port or the port 11a of the measurement device 10b, respectively, is connected, exemplarily internally connected, to the signal splitter 27a. Accordingly, it might be particularly advantageous if the signal splitter 27a is arranged after the port 11a.

In this context, one signal output by the signal splitter 27a is sent to the first signal level modification unit 14 and the second signal output by the signal splitter 27a is sent to the second signal level modification unit 24. Both signal level modification units 14, 24 are preferably configured in such a way that the signal level at the output is different to each other. Then, the signals output by the respective first and second signal level modification unit 14, 24 are fed to a first and second receiving unit 15, 25.

Advantageously, for instance, the corresponding processing of one port of the DUT 13 can be done in parallel and is therefore faster.

Figure 2C:
FIG. 2C shows a further exemplary embodiment of the measurement system comprising a further exemplary embodiment of the measurement device based on FIG. 2B.

Moreover, FIG. 2C depicts a further exemplary embodiment 20c of the measurement system comprising a further exemplary embodiment 10c of the measurement device based on FIG. 2B.

The measurement device 10c according to said FIG. 2C especially differs from the one 10b of FIG. 2B in that the signal splitter 27b is exemplarily arranged external to a housing of the measurement device 10c, wherein the measurement system 20c exemplarily comprises said signal splitter 27b.

As it can further be seen from FIG. 2C, one port of the DUT 13 is exemplarily connected to the signal splitter 27b, wherein two ports, especially external ports, exemplarily ports 11a and 11b, of the measurement device 10c are used for connecting the signal splitter 27b thereto.

Generally, with respect to the above-mentioned receiving unit 15, the above-mentioned at least one further receiving unit or the further receiving unit 25, it is noted that if two or more receiving units are used that they can either be operated in parallel or sequentially to one another. Accordingly, it might be particularly advantageous if the receiving unit 15 and the at least one further receiving unit or the further receiving unit 25, respectively, are operated in parallel or sequentially to one another.

Figure 3:
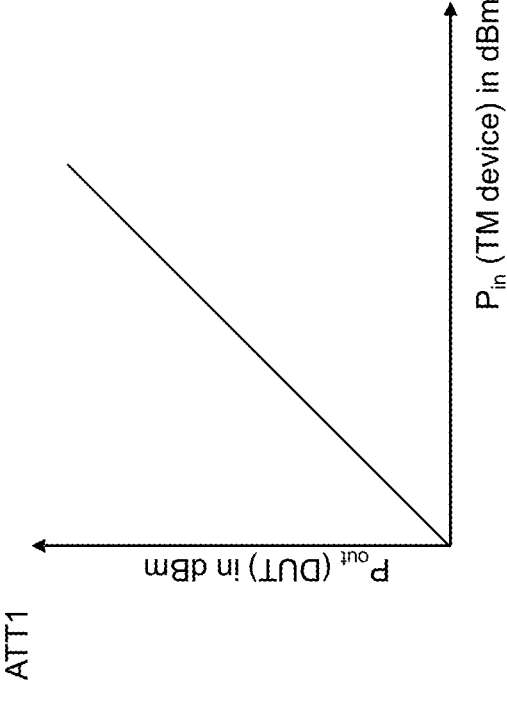
FIG. 3 shows an exemplary AM/AM curve in the context of a high attenuation.

Now, with respect to FIG. 3, an exemplary AM/AM curve in the context of the above-mentioned first attenuation is shown. Accordingly, the corresponding attenuation is set very high or maximum. Exemplarily, the signal level $P_{in}$ measured by the measurement device, such as the above-mentioned measurement device 10a, changes to the same extent as the signal level $P_{out}$ at the output of the device under test, such as the above-mentioned device under test 13, changes. Said device under test does not show any non-linear characteristics in this exemplary case.

Figure 4:
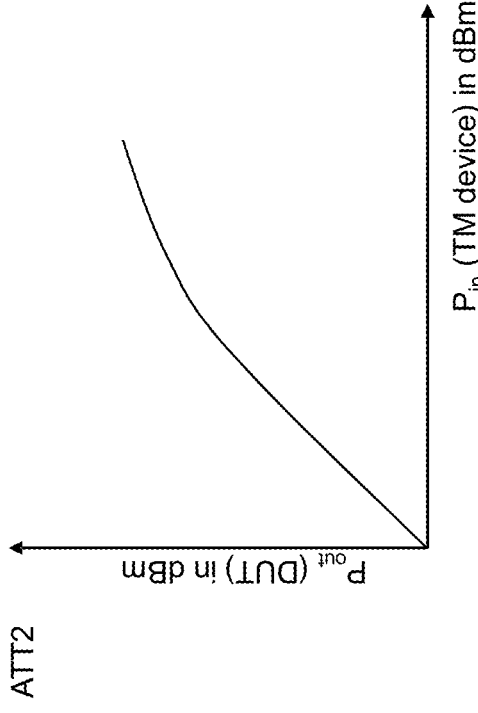
FIG. 4 shows an exemplary AM/AM curve in the context of a low attenuation.

In accordance with FIG. 4, an exemplary AM/AM curve in the context of the above-mentioned second attenuation is depicted. Accordingly, the corresponding attenuation is set very low or switched off. The signal level $P_{in}$ measured by the measurement device, such as the above-mentioned measurement device 10a, changes non-linearly compared to the signal level $P_{out}$ at the output of the device under test such as the above-mentioned device under test 13. From this, it can be concluded that the receive path for the measured signal shows non-linear characteristics.

Moreover, FIG. 5 illustrates an exemplary block diagram with respect to functioning regarding the inventive non-linearity determination or determining the above-mentioned information regarding non-linearities of the receiving unit 15, respectively.

Before said FIG. 5 is discussed in greater detail, some general explanations regarding the inventive non-linearity determination are made in the following:

Inventively, the first data stream and the second data stream or the first pattern and the second pattern, respectively, are compared with each other. From this, the non-linearity can be determined. If a non-linearity can be recognized in both streams or patterns, respectively, which remains the same in its type, then this comes from the device under test. If no non-linearity can be detected in the stream or pattern, respectively, in which the attenuation has a high value and if linearity can be detected in the stream or pattern, respectively, in which the attenuation has a low value, the non-linearity comes from the measurement device or from components in the corresponding receive path, respectively. This information can be used for further measurements to compensate the measurement signal for the known non-linearity according to the current signal level.

Again, with respect to FIG. 5, in accordance with an exemplary block 31, a first I/Q stream especially with a high attenuation is received exemplarily as a reference stream. Furthermore, according to an exemplary block 32, a second I/Q stream especially with a low attenuation is received exemplarily as a measurement stream.

In this context, it is noted it that it might be particularly advantageous if the first I/Q stream is such that no non-linear effects can be expected, while the second I/Q stream has a level in which non-linearities may be expected, but the SNR is preferably improved.

Especially in the light of the explanations above, it is noted that the above-mentioned first data stream comprise or be said first I/Q stream, whereas the above-mentioned second data stream can comprise or be said second I/Q stream. Accordingly, said receiving of said I/Q streams may be performed by the above-mentioned processing unit 16.

With respect to the I/Q streams of blocks 31 and 32, it is noted that said I/Q streams may especially comprise a modulated signal with a certain bandwidth and a certain amplitude distribution. It might be particularly advantageous if the same signal is used for characterization of the corresponding receiver, such as the above-mentioned receiving unit 15, which is also used later for the measurement of the device under test such as the above-mentioned device under test 13.

With respect to the above-mentioned signal, exemplarily received by the above-mentioned port 11*a* from the above-mentioned device under test 13, it is noted that it might be particularly advantageous if said signal comprises or is a modulated signal, especially a modulated communication signal, with a defined bandwidth and a defined amplitude distribution.

In this context, it is noted that the information regarding non-linearity of the above-mentioned receiving unit 15 is preferably determined at least over the corresponding bandwidth and at least over the corresponding level range of the signal being exemplarily the signal received by the above-mentioned port 11*a* from the above-mentioned device under test 13. It might be particularly advantageous if there is an a priori knowledge of said signal. Accordingly, the above-mentioned processing unit 16 may be configured to receive the first data stream, exemplarily the first I/Q stream, and/or the second data stream, exemplarily the second I/Q stream, in consideration of the a priori knowledge of the signal. It is noted that said a priori knowledge can be gained through a correlation of at least two respective measurement signals such as the above-mentioned reference stream and the above-mentioned measurement stream.

Again, with respect to the above-mentioned signal, exemplarily received by the above-mentioned port 11*a* from the above-mentioned device under test 13, it is noted that said signal can comprise or be a continuous wave signal.

Before the first I/Q stream and the second I/Q stream are compared exemplarily sample by sample according to block 34, said I/Q streams are, as illustrated by block 33, synchronized with respect to at least one of time, phase, frequency, or any combination thereof preferably with the aid of the above-mentioned processing unit 16. Accordingly, the processing unit 16 may be configured to synchronize the first data stream, exemplarily the first I/Q stream, and the second data stream, exemplarily the second I/Q stream, with respect to at least one of time, phase, frequency, or any combination thereof.

Furthermore, especially on the basis of the comparison according to block 34, in accordance with an exemplary block 35, behavioral modelling is performed preferably with the aid of the above-mentioned processing unit 16, thereby exemplarily generating at least one of an AM/AM table, an AM/AM curve, an AM/PM table, an AM/PM curve, or any combination thereof. Accordingly, the above-mentioned determining information regarding non-linearity of the receiving unit may comprise or be based on behavioral modelling.

Finally, FIGS. 6A and 6B show a flow chart of an embodiment of the inventive measurement method for performing measurements with respect to a device under test such as the above-mentioned device under test 13.

A first step 100 of said method comprises receiving a signal from the device under test especially with the aid of a port of a measurement device such as the above-mentioned port 11*a* or 11*b*, respectively, of the above-mentioned measurement device 10*a* or 10*b* or 10*c*, respectively. A second step 101 comprises modifying the corresponding level of the signal with the aid of a signal level modification unit, such as the above-mentioned signal level modification unit 14 of the above-mentioned measurement device 10*a* or 10*b* or 10*c*, respectively, in order to form a modified signal, the signal level modification unit being operable in at least a first operation mode and a second operation mode being different from the first operation mode. As it can further be seen from FIG. 6A, a third step 102 comprises receiving and digitizing the modified signal with the aid of a receiving unit, such as the above-mentioned receiving unit 15 of the above-mentioned measurement device 10*a* or 10*b* or 10*c*, respectively, in order to a form a digitized modified signal.

As it can be seen from FIG. 6B, a fourth step 103 comprises receiving a first data stream of the digitized modified signal for the case that the signal level modification unit is operated in the first operation mode with the aid of a processing unit such as the above-mentioned processing unit 16 of the above-mentioned measurement device 10*a* or 10*b* or 10*c*, respectively. A fifth step 104 comprises receiving a second data stream for the case that the signal level modification unit is operated in the second operation mode with the aid of the processing unit. Furthermore, a sixth step 105 comprises determining information regarding non-linearity of the receiving unit on the basis of a comparison of the first data stream and the second data stream with the aid of the processing unit.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The invention claimed is:

1. A measurement device for performing measurements with respect to a device under test, the measurement device comprising:
   a port for receiving a signal from the device under test,
   a signal level attenuator for modifying the corresponding level of the signal in order to form a modified signal, the signal level attenuator being operable in at least a first operation mode and a second operation mode being different, as to its signal level, from the first operation mode,
   a receiver for receiving and digitizing the modified signal in order to a form a digitized modified signal, and
   a processing unit,
wherein the processing unit is configured to receive a first data stream of the digitized modified signal for the case that the signal level attenuator is operated in the first operation mode and to receive a second data stream for the case that the signal level attenuator is operated in the second operation mode, and
wherein the processing unit is configured to determine non-linearity of the receiver on the basis of a comparison of the first data stream and the second data stream.

2. The measurement device according to claim 1, wherein the signal level of the first operation mode is set such that the signal-to-noise-ratio is high but the receiver causes non-linearity effects, and the signal level of the second operation mode is set lower than the signal level of the first operation mode such that the receiver causes essentially no non-linearity effects.

3. The measurement device according to claim 1, wherein the signal comprises or is a radio frequency signal, and/or
wherein the receiver comprises non-linearities and/or at least one non-linear element, and/or
wherein the measurement device comprises or is a signal analyzer, a vector network analyzer, or an oscilloscope.

4. The measurement device according to claim 1, wherein the first operation mode comprises applying a first attenuation to the signal, and/or
wherein the second operation mode comprises applying a second attenuation to the signal.

5. The measurement device according to claim 1, wherein the signal level attenuator is free of an amplifier and/or a diode.

6. The measurement device according to claim 1, wherein the receiver comprises at least one of a filter, an amplifier, a mixer, an analog-to-digital converter, or any combination thereof.

7. The measurement device according to claim 1, wherein the signal comprises or is a periodic signal, and/or
wherein the first data stream and the second data stream comprise the same pattern.

8. The measurement device according to claim 1, wherein the processing unit is configured to compensate further measurements with respect to the device under test on the basis of the information regarding non-linearity of the receiver.

9. The measurement device according to claim 1, wherein the measurement device comprises:
   at least one further port for receiving at least one further signal from the device under test or from at least one further device under test,
   at least one further signal level attenuator for modifying the corresponding level of the at least one further signal in order to form at least one further modified signal, the at least one further signal level attenuator being operable in at least one further first operation mode and at least one further second operation mode being different from the at least one further first operation mode,
   at least one further receiver for receiving and digitizing the at least one further modified signal in order to a form at least one further digitized modified signal,
wherein the processing unit is configured to receive at least one further first data stream of the at least one further digitized modified signal for the case that the at least one further signal level attenuator is operated in the at least one further first operation mode and to receive at least one further second data stream for the case that the at least one further signal level attenuator is operated in the at least one further second operation mode, and
wherein the processing unit is configured to determine non-linearity of the at least one further receiver on the basis of a comparison of the at least one further first data stream and the at least one further second data stream.

10. The measurement device according to claim 1, wherein the measurement device is used for and/or in the context of an error vector magnitude measurement, and/or
wherein the measurement device is used for and/or in the context of a measurement requiring a maximum signal-to-noise ratio.

11. A measurement system comprising:
a measurement device comprising:
   a port for receiving a signal from a device under test,
   a signal level attenuator for modifying the corresponding level of the signal in order to form a modified signal, the signal level attenuator being operable in at least a first operation mode and a second operation mode being different, as to its signal level, from the first operation mode,
   a receiver for receiving and digitizing the modified signal in order to a form a digitized modified signal, and
   a processing unit,
wherein the processing unit is configured to receive a first data stream of the digitized modified signal for the case that the signal level attenuator is operated in the first operation mode and to receive a second data stream for the case that the signal level attenuator is operated in the second operation mode, and wherein the processing unit is configured to determine non-linearity of the receiver on the basis of a comparison of the first data stream and the second data stream; and the device under test connected to said measurement device.

12. A measurement method for performing measurements with respect to a device under test, the measurement method comprising the steps of:

receiving a signal from the device under test, modifying the corresponding level of the signal with the aid of a signal level attenuator in order to form a modified signal, the signal level attenuator being operable in at least a first operation mode and a second operation mode being different from the first operation mode, receiving and digitizing the modified signal with the aid of a receiver in order to a form a digitized modified signal, receiving a first data stream of the digitized modified signal for the case that the signal level attenuator is operated in the first operation mode with the aid of a processing unit, receiving a second data stream for the case that the signal level attenuator is operated in the second operation mode with the aid of the processing unit, and determining non-linearity of the receiver on the basis of a comparison of the first data stream and the second data stream with the aid of the processing unit.

13. The method of claim 12, wherein the signal level of the first operation mode is set such that the signal-to-noise-ratio is high but the receiver causes non-linearity effects, and the signal level of the second operation mode is set lower than the signal level of the first operating mode such that the receiver causes essentially no non-linearity effects.

14. The measurement method according to claim 13, wherein the signal comprises or is a radio frequency signal, and/or wherein the receiver comprises non-linearities and/or at least one non-linear element.

* * * * *